United States Patent [19]

Yamauchi

[11] Patent Number: 5,024,919
[45] Date of Patent: Jun. 18, 1991

[54] PROCESS FOR FORMING FINE PATTERN IN SEMICONDUCTOR DEVICE

[75] Inventor: Takahiro Yamauchi, Tokyo, Japan

[73] Assignee: Oki Electric Industry Co., Ltd., Tokyo, Japan

[21] Appl. No.: 271,301

[22] Filed: Nov. 15, 1988

[30] Foreign Application Priority Data

Nov. 16, 1987 [JP] Japan ............................... 62-287288

[51] Int. Cl.$^5$ ............................................... G03F 9/00
[52] U.S. Cl. .................................... 430/312; 430/156; 430/273; 430/394
[58] Field of Search ................ 430/312, 394, 156, 273

[56] References Cited

U.S. PATENT DOCUMENTS 4,663,275  5/1987  West et al. .......................... 430/271
4,705,729 11/1987  Sheats ..................................... 430/5
4,770,739  9/1988  Orvek et al. ......................... 156/643

FOREIGN PATENT DOCUMENTS 173413  8/1985  Japan .

Primary Examiner—Hoa Van Le
Assistant Examiner—Thorl Chea
Attorney, Agent, or Firm—Wenderoth, Lind & Ponack

[57] ABSTRACT

In the disclosed process for forming a fine pattern in a semiconductor device, an upperlayer polymeric film so photosensitive to ultraviolet light as to be opague to deep ultraviolet light upon exposure to ultraviolet light is formed on an underlayer resist photosensitive to deep ultraviolet light, provided on an underlaying layer, optionally with an interlayer formed as a barrier or isolation layer therebetween. After the upperlayer polymeric film is exposed through a mask to ultraviolet light to form therein areas opague to deep ultraviolet light with the other areas remaining transparent to deep ultraviolet light, the upperlayer polymeric film serves as a mask for the underlayer resist in subsequent blanket exposure to deep ultraviolet light. After removal of the upperlayer polymeric film and the interlayer if any, the underlayer resist is developed to form a pattern.

6 Claims, 4 Drawing Sheets

FIG_1a 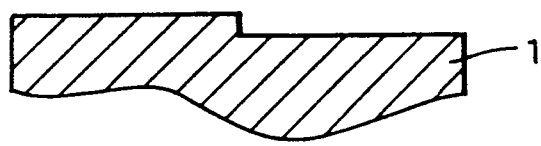
FIG_1b 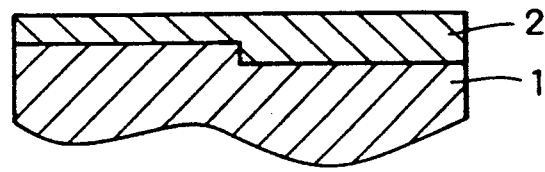
FIG_1c 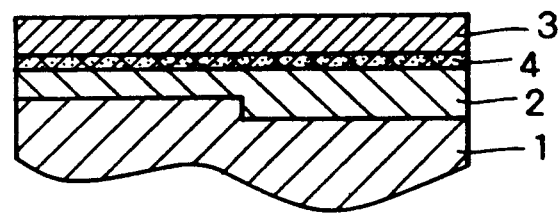
FIG_1d 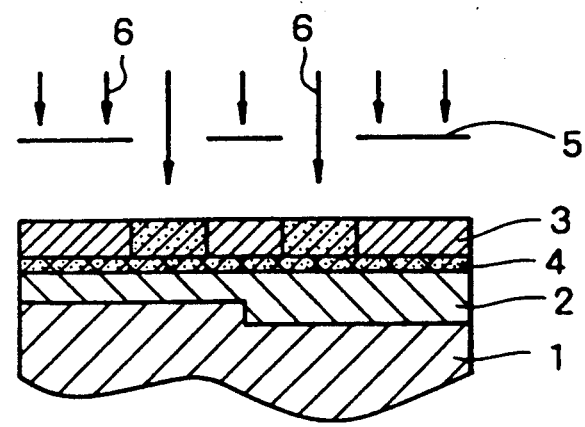

FIG_1e
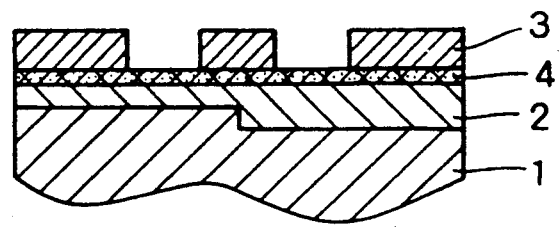
FIG_1f
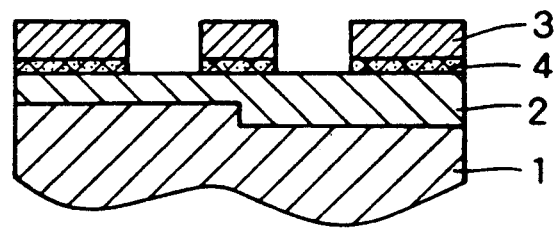
FIG_1g
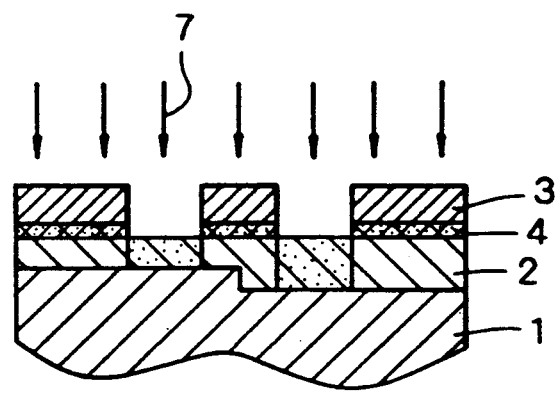
FIG_1h
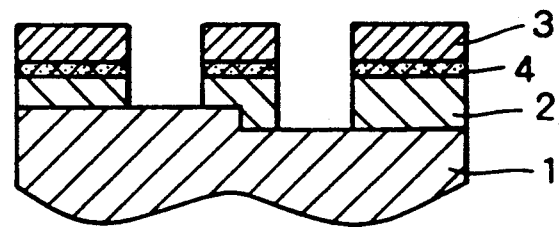

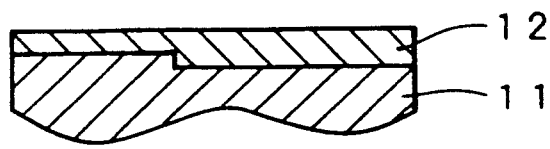
FIG_2a
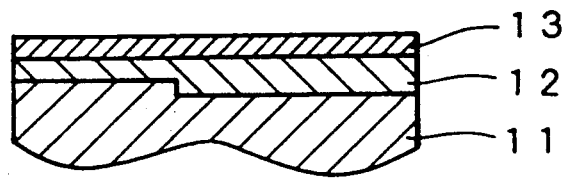
FIG_2b
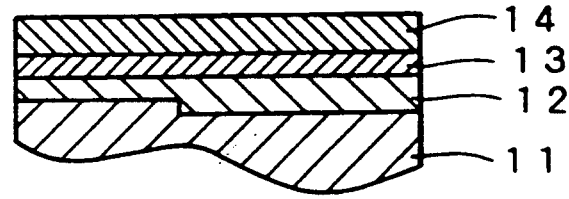
FIG_2c
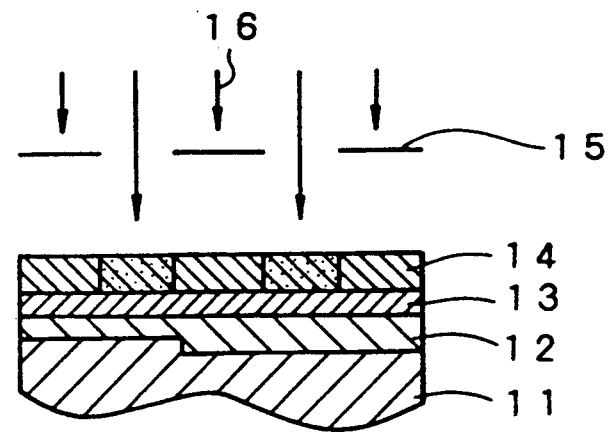
FIG_2d

FIG_2e
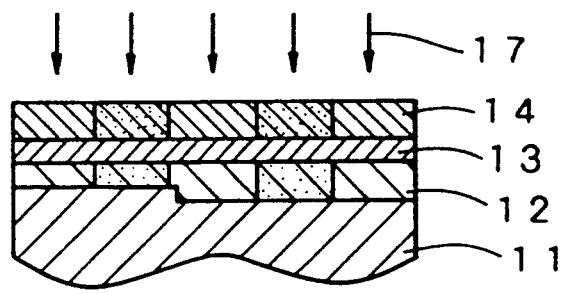
FIG_2f
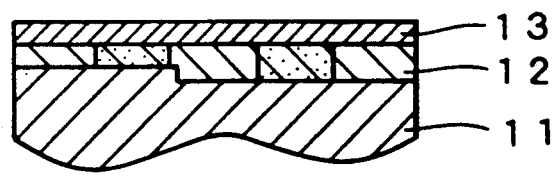
FIG_2g
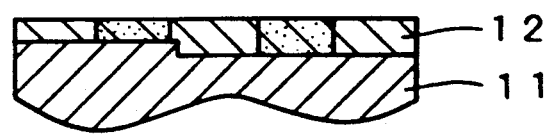
FIG_2h
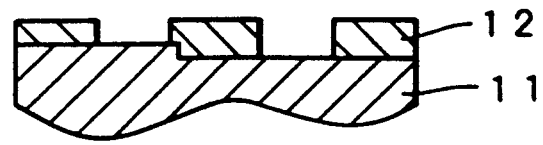

PROCESS FOR FORMING FINE PATTERN IN SEMICONDUCTOR DEVICE

BACKGROUND OF THE INVENTION

1. Field of the Invention

The present invention relates to a process for forming a fine pattern in a semiconductor device to form a circuit pattern in an IC (integrated circuit), an LSI (large-scale integrated circuit), or the like.

2. Description of the Prior Art

The technique of forming a fine pattern in a semiconductor device are described in "Submicron Ryoiki niokeru Pattern Keisei Gijutsu (Techniques of forming Pattern in Submicron Order)," Okidenki Kenkyu Kaihatsu No. 133 (Okidenki Research and Development No. 133), Vol. 54, No. 1, Jan., pp. 85-86, 1987; J. Vac. Sci. Technol., 19–(4), Nov./Dec., pp. 1313-1319, 1981; etc.

As can be understood from these pieces of literature, the techniques of forming a fine pattern in an IC or an LSI include multiple-layer resist processes, in which a structure comprising different kinds of resist in laminate fashion is used to utilize an effect of planarizing a substrate and/or decreasing light reflection by the underlayer resist to thereby improve the resolution of the upperlayer resist in pattern formation therein, thus enabling a fine pattern to be formed.

The multiple-layer resist processes include a deep UV (hereinafter referred to as "deep ultraviolet light" when necessary) blanket exposure method and an RIE (refractive ion etching) method, which differ from each other in the way of transferring an upperlayer resist pattern to an underlayer resist.

Of them, the deep UV blanket exposure method uses as an underlayer resist a resist having a photosensitivity to deep UV light, and comprises the step of blanket exposure (exposure of a whole surface of a substrate-cum-resist to parallel light without use of a mask except for a resist used as a mask as mentioned below) to deep UV light with an upperlayer resist pattern being used as a mask to transfer the upperlayer resist pattern to the underlayer resist.

FIG. 1 illustrates a representative instance of a double-layer resist process which is carried out according to the deep UV blanket exposure method. The instance illustrated in FIG. 1 is an example of the double-layer resist process which is a technique disclosed in J. Vac. Sci. Technol., 19 (4), Nov./Dec., pp. 1313-1319, 1981, and in which a positive resist photosensitive to UV light (hereinafter referred to as "ultraviolet light" when necessary) is used as the upperlayer resist while a positive resist photosensitive to deep UV light is used as the underlayer resist.

First, an underlayer resist 2 [made of, for example, polymethyl methacrylate (PMMA), a copolymer of methyl methacrylate and methacrylic acid (P(MMA-MAA)), or polymethyl isopropenyl ketone (PMIPK)] as shown in FIG. 1b is formed on a Si substrate 1 as shown in FIG. 1a, followed by formation of an upperlayer resist 3 (made of, for example, AZ 1350, AZ 1450, Hunt HRP 206, Hunt MPR, Polychrome PC 129, or Kodak 809) as shown in FIG. 1c on the underlayer resist 2. When the upperlayer resist 3 is directly deposited on the underlayer resist 2, a mixed layer (hereinafter referred to as an "interfacial layer") is formed in the interface therebetween.

After the formation of the underlayer resist 2 and the upperlayer resist 3, the latter is subjected to photolithography comprising exposure to UV light 6 through a mask 5 as shown in FIG. 1d to form a pattern of the resist 3 as shown in FIG. 1e.

Subsequently, the exposed areas of the interfacial layer 4 are removed using oxygen plasma or a suitable method as shown in FIG. 1f.

Subsequently, the pattern of the upperlayer resist 3 is transferred to the underlayer resist 2 using deep UV light 7 with the pattern of the upperlayer resist 3 being used as a mask according to the deep UV blanket exposure method as shown in FIG. 1g.

Thereafter, the underlayer resist 2 is developed to obtain a final resist pattern as shown in FIG. 1h.

As is apparent from the above description, however, the above-mentioned process has defects in that the steps are complicated and hence it is inevitable that equipment of a complicated structure must be used in practicing the process, because two development operations be carried out.

SUMMARY OF THE INVENTION

An object of the present invention is to provide a process for forming a fine pattern in a semiconductor device which provides a solution for the above-mentioned problems in the steps of the above-mentioned conventional process and the inevitable use of equipment with a complicated structure in practicing the process.

The process for forming a fine pattern in a semiconductor device according to the present invention is characterized by introduction thereinto the step of forming, as an upperlayer, a polymeric film comprising a material so photosensitive to ultraviolet light as to be rendered opaque to deep ultraviolet light upon exposure to ultraviolet light after formation on an underlying layer of an underlayer resist photosensitive to deep ultraviolet light, and the step of exposing the upperlayer polymeric film through a mask to ultraviolet light to form therein an area(s) transparent to deep ultraviolet light and an area(s) opaque to deep ultraviolet light, followed by blanket exposure to deep ultraviolet light.

Since the above-mentioned steps are introduced into the process for forming a fine pattern in a semiconductor device according to the present invention, the aforementioned defects are obviated. Specifically, when the polymeric film formed as the upperlayer is exposed through a mask to ultraviolet light, the polymeric film is rendered opaque to deep ultraviolet light in an area(s) thereof exposed to ultraviolet light while the other area(s) thereof not exposed to ultraviolet light still remains transparent to deep ultraviolet light. Therefore, after blanket exposure to deep ultraviolet light and subsequent removal of the polymeric film, removal of an interlayer (barrier or isolation layer) if any, and development of the underlayer resist can be carried out continuously.

BRIEF DESCRIPTION OF THE DRAWINGS

The foregoing and other objects and advantages of the present invention will be seen by reference to the description, taken in connection with the accompanying drawings, in which:

FIGS. 1a to 1h are process diagrams, in cross section, of a conventional process for forming a fine pattern in a semiconductor device according to the deep ultraviolet light blanket exposure method; and FIGS. 2a to 2h are process diagrams, in cross section, of an example of the process for forming a fine pattern in a semiconductor device according to the present invention.

DETAILED DESCRIPTION OF PREFERRED EMBODIMENT

The process for forming a fine pattern in a semiconductor device according to the present invention will be now described by example while referring to the accompanying drawing.

Example

FIGS. 2a to 2h are process diagrams, in cross section, of an example of the process according to the present invention.

In this example, description will be made of a case where use is made of chloromethylated polystyrene (hereinafter referred to as "CMS") as the material of an underlayer resist, and of a polymer containing diphenylnitron [for example, CEM (contrast enhancement material) manufactured by General Electric; hereinafter referred to as "CEM"] as the material of an upper polymeric layer.

First, as shown in FIG. 2a, a CMS film, which is an underlayer resist 12 photosensitive to deep UV light, is formed on an underlying layer 11 such, for example, as a substrate by spin coating. The surface of this substrate 11 has differences in level because elements and/or element-constituting areas have already been built in the substrate.

Thereafter, the substrate with the CMS film is heat-treated on a hot plate or in an oven at a temperature of at most 130° C.

Subsequently, as shown in FIG. 2b, a 5% aqueous solution of polyvinyl alcohol (hereinafter referred to as "PVA") is used to form a PVA film as an interlayer 13 (which serves as a barrier or isolation layer) by spin coating.

Subsequently, as shown in FIG. 2c, a CEM film 14 is formed by spin coating to produce a laminated or stacked structure. The above-mentioned coating operations are carried out so as to provide a CMS film thickness of at most 1.5 μm, a PVA film thickness of at most 0.2 μm, and a CEM film thickness of at most 1 μm.

Subsequently, as shown in FIG. 2d, a mask pattern is transferred to the upperlayer CEM film by exposure thereof through a mask 15 to UV light 16. This operation renders the CEM film 14 opaque to deep UV light 17 (see FIG. 2e) in areas thereof irradiated with UV light 16 while leaving the other areas thereof, not irradiated with UV light 16, transparent to deep UV light 17.

Subsequently, as shown in FIG. 2e, blanket exposure of the laminated or stacked structure to deep UV light 17 is carried out. The wavelength of the deep UV light 17 used herein is in the range of 200 to 250 nm.

In the step as mentioned just above, the amount of exposure to the deep UV light 17 is not more than about 200 mJ/cm² in terms of energy.

Subsequently, as shown in FIG. 2f, the upperlayer CEM film 14 is removed with an aromatic solvent such as anisole, xylene, ethylbenzene, or a mixture thereof by paddling or spraying for about 30 seconds to about one minute.

Subsequently, the laminated or stacked structure with the remaining film is dried by spin drying or N₂ blowing, and the interlayer PVA film 13 is then removed with water as shown in FIG. 2g. The removal of the PVA film 13 is effected by paddling or spraying for about 30 seconds to about one minute like the removal of the CEM film 14.

After the structure with the remaining CEM film 12 is dried by spin drying or N₂ blowing to remove the remaining water therefrom, the underlayer CMS resist 12 is developed as shown in FIG. 2h. The development may be effected according to the same method as employed in the case of single-layer resist process. For example, the development is effected with a mixed solvent of isoamyl acetate and ethyl cellosolve acetate by dipping or spraying.

As described above in detail, since pattern formation is conducted using an underlayer resist photoresistive to deep UV light and an upperlayer polymeric film comprising a material so photosensitive to UV light as to be rendered opaque to deep UV light upon exposure thereof to UV light according to the process of the present invention, only one development operation will suffice to thereby simplify the steps of the process and, hence, simplify the structure of equipment to be used in practicing the process as well in comparison with the conventional double-layer resist process.

Since formation of an interlayer and an upperlayer polymeric film can be carried out continuously while removal of the upperlayer polymeric film and the interlayer and development of an underlayer resist can be carried out by continuously feeding stripper or removal liquids and a developer liquid onto the film surfaces, the structure of equipment to be used in practicing the process of the present invention can be simplified, as compared with that used in the conventional process.

Further, since a circuit pattern is transferred to the underlayer resist through the upperlayer polymeric film photosensitive to UV light according to the process of the present invention, the effects of planarizing a substrate and decreasing light reflection by the underlayer resist can provide the same level of practical resolution as in the case of the conventional multiple-layer resist processes.

What is claimed is:

1. A process for forming a fine pattern in a semiconductor device, comprising the steps of:
   (a) forming on an underlying layer an underlayer resist photosensitive to deep ultraviolet light, said underlayer resist being made of chloromethylated polystyrene and which is developed with a mixed solvent of isoamyl acetate and ethyl cellosolve acetate in the step of developing said underlayer resist;
   (b) forming an interlayer as a barrier or isolation layer on said underlayer resist;
   (c) forming on said interlayer an upper layer polymeric film comprising a material so photoresistive to ultraviolet light as to be rendered opaque to deep ultraviolet light upon exposure thereof to ultraviolet light to form a laminated structure;
   (d) exposing said laminated structure through a mask to ultraviolet light to form in said upperlayer polymeric film an area transparent to deep ultraviolet light and an area opaque to deep ultraviolet light;
   (e) subjecting said exposed laminated structure to blanket exposure to deep ultraviolet light;
   (f) removing said upperlayer polymeric film;
   (g) removing said interlayer; and
   (h) developing said underlayer resist.

2. A process for forming a fine pattern in a semiconductor device as claimed in claim 1, wherein said interlayer is made of a water-soluble polymer.

3. A process for forming a fine pattern in a semiconductor device as claimed in claim 2, wherein said water-soluble polymer is polyvinyl alcohol.

4. A process for forming a fie pattern in a semiconductor device, comprising the steps of:
   (a) forming on an underlying layer an underlayer resist photosensitive to deep ultraviolet light;
   (b) forming an interlayer as a barrier or isolation layer on said underlayer resist;
   (c) forming on said interlayer an upper layer polymeric film comprising a material so photoresistive to ultraviolet light as to be rendered opaque to deep ultraviolet light upon exposure thereof to ultraviolet light to form a laminated structure, said upperlayer polymeric film being made of a polymer containing diphenylnitron;
   (d) exposing said laminated structure through a mask to ulatraviolet light to form in said upperlayer polymeric film an area(s) transparent to deep ultraviolet light and an area(s) opaque to deep ultraviolet light;
   (e) subjecting said exposed laminated structure to blanket exposure to deep ultraviolet light;
   (f) removing said upperlayer polymeric film;
   (g) removing said interlayer; and
   (h) developing said underlayer resist.

5. A process for forming a fine pattern in a semiconductor device as claimed in claim 4, wherein said upper layer polymeric film is removed with an aromatic solvent.

6. A process for forming a fine pattern in a semiconductor device as claimed in claim 5, wherein said aromatic solvent is at least one member selected from the group consisting of nisole, xylene, and ethyl benzene.

* * * * *

UNITED STATES PATENT AND TRADEMARK OFFICE
CERTIFICATE OF CORRECTION

PATENT NO. : 5,024,919

DATED : June 18, 1991

INVENTOR(S) : Takahiro YAMAUCHI

It is certified that error appears in the above-identified patent and that said Letters Patent is hereby corrected as shown below:

Column 1, line 19, change "19-(4)" to -- 19 (4) --.

Column 2, line 21, after "tions" insert -- must --.

Column 4, line 62, change "area" to -- area(s) --;
         line 63, change "area" to -- area(s) --.

Column 5, line 7, change "fie" to -- fine --.

Column 6, line 18, change "nisole" to -- anisole --.

Signed and Sealed this

Fifteenth Day of December, 1992

*Attest:*

DOUGLAS B. COMER

*Attesting Officer*       *Acting Commissioner of Patents and Trademarks*